US005498297A

United States Patent [19]
O'Neill et al.

[11] Patent Number: 5,498,297
[45] Date of Patent: Mar. 12, 1996

[54] PHOTOVOLTAIC RECEIVER

[75] Inventors: Mark J. O'Neill, Keller; Almus J. McDanal, Richardson, both of Texas.

[73] Assignee: Entech, Inc., Airport, Tex.

[21] Appl. No.: 306,773

[22] Filed: Sep. 15, 1994

[51] Int. Cl.$^6$ .......................... H01L 31/052; H01L 31/18
[52] U.S. Cl. .......................... 136/246; 136/251; 136/259; 437/2
[58] Field of Search .......................... 136/246, 251, 136/259; 437/2–5, 207, 209, 211, 219, 224

[56] References Cited

U.S. PATENT DOCUMENTS

| | | | |
|---|---|---|---|
| 3,268,366 | 8/1966 | Guyot | 136/251 |
| 3,565,719 | 2/1971 | Webb | 156/212 |
| 3,780,424 | 12/1973 | Forestieri et al. | 437/2 |
| 3,833,425 | 9/1974 | Leinkram et al. | 136/246 |
| 3,957,537 | 5/1976 | Baskett et al. | 136/251 |
| 4,118,249 | 10/1978 | Graven et al. | 136/246 |
| 4,180,414 | 12/1979 | Diamond et al. | 136/246 |
| 4,200,472 | 4/1980 | Chappell | 136/246 |
| 4,209,347 | 6/1980 | Klein | 136/246 |
| 4,280,853 | 7/1981 | Palazzetti et al. | 136/246 |
| 4,361,717 | 11/1982 | Gilmore et al. | 136/246 |
| 4,379,202 | 4/1983 | Chalmers | 136/256 |
| 4,388,481 | 6/1983 | Uroshevich | 136/246 |
| 4,711,972 | 12/1987 | O'Neill | 136/246 |
| 4,836,861 | 6/1989 | Peltzer et al. | 136/246 |
| 4,861,387 | 8/1989 | Matsumoto | 136/256 |
| 4,888,061 | 12/1989 | Wenz | 136/251 |
| 4,968,372 | 11/1990 | Maass | 156/249 |
| 5,096,505 | 3/1992 | Fraas et al. | 136/246 |
| 5,118,361 | 6/1992 | Fraas et al. | 136/246 |
| 5,123,968 | 6/1992 | Fraas et al. | 136/246 |
| 5,125,983 | 6/1992 | Cummings | 136/246 |
| 5,167,724 | 12/1992 | Chiang | 136/246 |
| 5,223,044 | 6/1993 | Asai | 136/255 |
| 5,232,860 | 8/1993 | Kawanishi et al. | 437/2 |
| 5,252,141 | 10/1993 | Inoue et al. | 136/251 |
| 5,255,666 | 10/1993 | Curchod | 126/569 |
| 5,374,317 | 12/1994 | Lamb et al. | 136/246 |

FOREIGN PATENT DOCUMENTS

| | | | |
|---|---|---|---|
| 56-54077 | 5/1981 | Japan | 136/246 |
| 60-42854 | 3/1985 | Japan | 136/251 |
| 60-194253 | 10/1985 | Japan | 136/246 |
| 60-214550 | 10/1985 | Japan | 136/251 |
| 62-101085 | 5/1987 | Japan | 136/246 |

OTHER PUBLICATIONS

M. F. Piszczor et al, *Conference Record, 21st IEEE Photovoltaic Specialists Conf.* (1990), pp. 1271–1276.
J. E. Avery et al, ibid, pp. 1277–1281.
N. R. Kaminarn et al, ibid, pp. 876–880.
N. Kaminar et al, *Conference Record, 16th IEEE Photovoltaic Specialists Conf.* (1982), pp. 675–678.
M. J. O'Neill, *Conference Record, 18th IEEE Photovoltaic Specialists Conf.* (1985), pp. 1234–1239.
M. J. O'Neill, *Conference Record, 19th IEEE Photovoltaic Specialists Conf.* (1987), pp. 1402–1407.
L. M. Fraas et al, *Conference Record, 21st IEEE Photovoltaic Specialists Conf.* (1990), pp. 190–195.

*Primary Examiner*—Aaron Weisstuch
*Attorney, Agent, or Firm*—Sankey & Luck

[57] ABSTRACT

A photovoltaic receiver is disclosed where said receiver includes at last one photovoltaic cell coupled to an electrical load via the use of an electrical conductor and a bypass diode, the combination secured to a heat sink via the use of a Tefzel film incorporating a pressure sensitive adhesive on both its upper and lower surfaces, a prismatic top cover and a second Tefzel film layer secured to said first layer so as to encapsulate said photovoltaic cell.

22 Claims, 3 Drawing Sheets

PHOTOVOLTAIC RECEIVER

BACKGROUND OF THE INVENTION

1. Field of the Invention

The present invention is generally directed to a photovoltaic receiver assembly for use in a photovoltaic concentrator module and a novel process for its construction. More specifically, the present invention is directed to a photovoltaic receiver comprising a plurality of photovoltaic cell packages, where each package includes a cell, two or more electrical conductors, one or more bypass diodes, and a light concentrating prism cover, where the cell packages are mounted to a heat sink and are encapsulated within an impermeable dielectric film to prevent the ingress of moisture.

2. Description of the Prior Art

Photovoltaic cells, commonly known as solar cells, are a well known means for producing electrical current from electromagnetic radiation. Traditional solar cells comprise junction diodes fabricated from appropriately doped semiconductor materials. Such devices are typically fabricated as thin, flat wafers with the junction formed parallel to and near one of the flat surfaces. Photovoltaic cells are intended to be illuminated through their so called "front" surface. Electromagnetic radiation absorbed by the semiconductor produces electron-hole pairs in the semiconductor. These electron-hole pairs may be separated by the junction's electric field, thereby producing a photocurrent.

Photovoltaic cells are presently used in two types of commercial power modules, namely flat-plate, one-sun modules, and concentrating, multi-sun modules. The former are typically mounted on roof tops or fixed flames. The latter typically track the sun's apparent motion and use lenses or mirrors to focus sunlight onto the photovoltaic cells. The primary advantage of the concentrating module is a substantial savings in required semi-conductor area. For example, a Fresnel lens can be used to focus sunlight at 20 times the normal one-sun intensity. To produce a fixed amount of power of, for example, 1 kW, a 20-sun concentrating module will use an amount of photovoltaic cell material which is 95% less expensive than a comparable flat-plate, one-sun module.

In concentrating modules, groups of photovoltaic cell packages are electrically coupled to form photovoltaic receivers. In addition to including a plurality of photovoltaic cells, contemporary photovoltaic receivers have included means to concentrate electromagnetic radiation onto the active surface area of each solar cell. One novel means to concentrate solar radiation in this fashion is disclosed in U.S. Pat. No. 4,711,972 issued to O'Neill, the disclosure of which is incorporated herein.

Disadvantages of traditional photovoltaic receivers have heretofore resided in the labor costs associated with their assembly. The photovoltaic receiver generally includes a heat sink, one or more solar cells, a light concentration means, bypass diode circuitry, electrical interfaces, and a dielectric encapsulant. One of the main difficulties in receiver construction is to satisfactorily encapsulate the cells so as to avoid electrical shorts, characterized by leakage currents, when the receiver is exposed to electrolyte-laden water. While it is possible to encapsulate solar cells to avoid such shorts, the assembly cost associated with such encapsulation has heretofore been prohibitive.

Other disadvantages have resided in the detrimental filtering effect traditional encapsulants have had on the solar cells. When traditional encapsulants and the means by which they are secured to the solar cell begin to break down due to effects of moisture and dirt, temperature extremes or the like, they frequently tend to discolor and thereby impede receipt of electromagnetic radiation by the solar cells. Such degradation diminishes the effectiveness of the photovoltaic receiver.

Still other disadvantages of traditional photovoltaic receivers relate to their manufacturing processes. Most, if not all, prior art receivers have been assembled using messy, expensive, and trouble-prone liquid adhesives to bond the solar cells to the heat sink, and still more messy, expensive, and trouble-prone liquid encapsulants to protect the receiver from the environment. Traditionally, these adhesives have been based on silicone materials, which require long time periods or elevated temperatures to cure, and which remain sticky and soft after curing. These properties are not desirable for long-term durability and longevity.

Further disadvantages of traditional photovoltaic receivers relate to their electrical and thermal properties. Traditional photovoltaic receivers incorporate photovoltaic cells which must be thermally coupled with the heat sink to maintain low operating temperatures and corresponding high electrical conversion efficiencies. However, the cells must be electrically isolated from the heat sink for reasons of personal safety. These thermal and electrical requirements have proven to be very difficult to achieve with reasonably priced materials.

SUMMARY OF THE INVENTION

The present invention addresses the above and other disadvantages associated with prior art photovoltaic receivers and methods for their construction.

The present invention is directed to a photovoltaic receiver which in a preferred embodiment comprises a plurality of interconnected solar cells which are electrically coupled to an electrical load or storage device via a series of electrical conductors. These electrical conductors are maintained in a spaced relationship relative to each other and are electrically coupled to an electrical bypass diode. A light concentrating cover is attached to the front surface of the photovoltaic cell to enhance light absorption thereby. The resulting assembly is seated on a high efficiency heat sink via the use of an impermeable film preferably incorporating the use of pressure sensitive adhesive applied to both its upper and lower surfaces and of a width and length sufficient to define an adhesive border around the solar cell assembly. The cell assembly is then encapsulated via the use of a second, transparent impermeable film layer which is disposed over the cell assembly and affixed in place via the adhesive border defined by the first film layer.

The resulting photovoltaic receiver is both highly efficient and durable. Moreover, the labor costs associated with the construction of the receiver are dramatically reduced as a result of the simplified unitary film encapsulant which eliminates the need to insulate the individual electrical joints between the cells. The new receiver approach of the present invention is far simpler than prior approaches. By employing the novel approach of the present invention, a standard 37-cell receiver which included some six hundred parts, may now be assembled using some three hundred fewer parts.

The present invention provides many performance benefits over the art. One such advantage is seen in the reduction of leakage current. Dielectrically, prior art receivers have operated with leakage currents of up to 50 microamps between the cell string and the heat sink when a potential of 2,200 volts was applied. The receiver of the present invention typically demonstrates a leakage current of less than 1 microamp at 2,200 volts.

Another advantage is seen in the minimized heat differential between the cell package and the heat sink. Thermally, cells in prior art receivers typically operate at temperatures 25 degrees Centigrade higher than the temperature of the heat sink. By comparison, the solar cells of the present invention typically operate at a temperature differential of only 10–13 degrees Centigrade. This cell temperature reduction equates to about 5% higher power output for the entire photovoltaic system.

Yet other advantages of the method of the present invention reside in its efficiency and cost effectiveness in comparison to prior and similar methods of construction. Yet further benefits of the present invention are seen in the estimated six percent power gain realized as a result of the ability to add additional photovoltaic power cells as a result of the efficiency of the encapsulation process. Yet another advantage of the present invention is the superior dielectric isolation of the photovoltaic cell assemblies.

Other benefits and advantages of the present invention will become apparent in view of the following drawings and detailed description.

DETAILED DESCRIPTION OF THE PREFERRED EMBODIMENTS

The present invention is directed to an improved photovoltaic receiver for use in a concentrating photovoltaic module and may be understood by reference to FIGS. 1–4.

Figure 1:
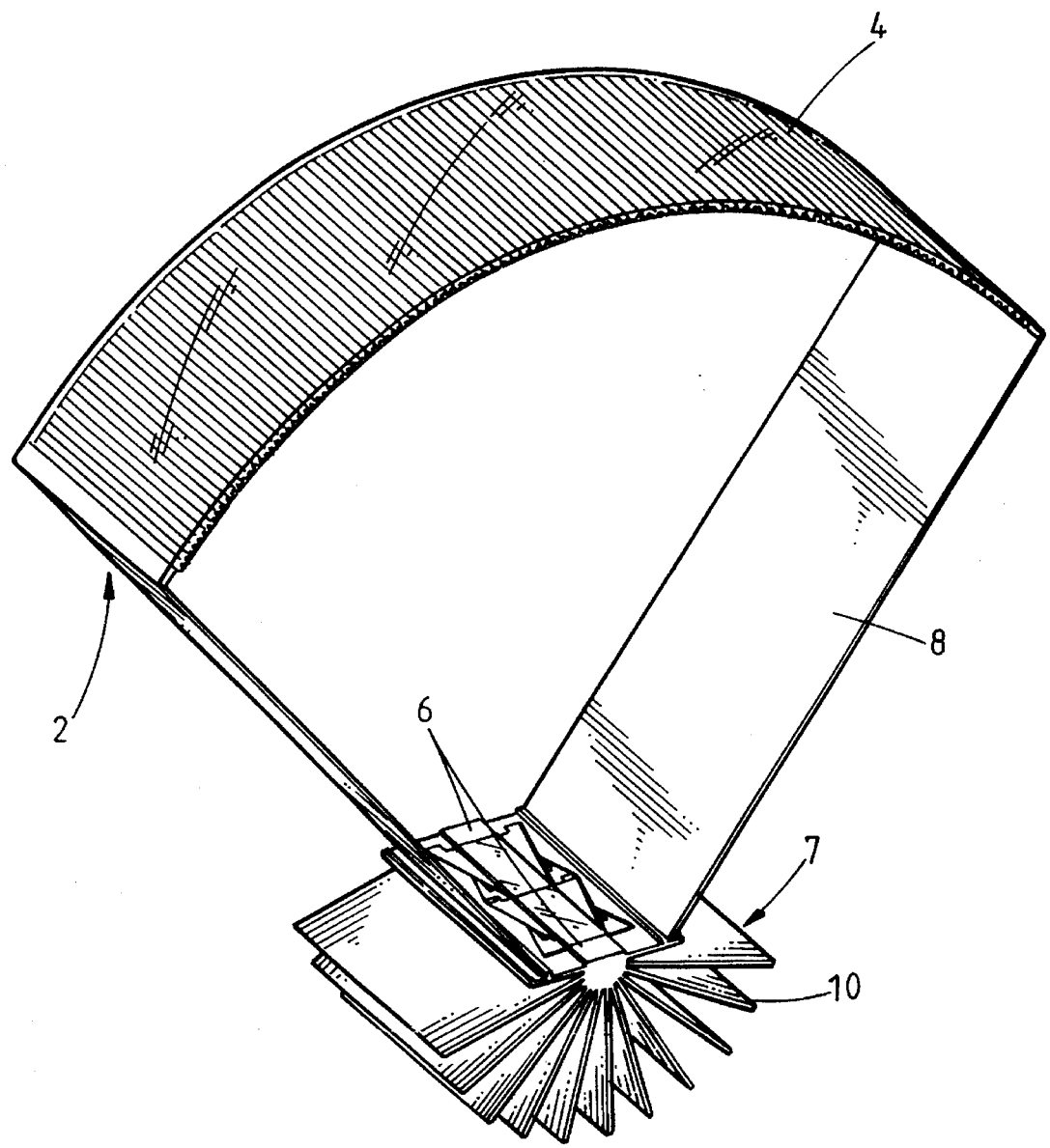
FIG. 1 illustrates an isometric, cross-sectional view of a portion of a concentrating photovoltaic module of the present invention.

FIG. 1 illustrates a concentrating photovoltaic module 2 which includes an acrylic plastic Fresnel lens 4 to focus sunlight onto silicon solar cell packages 6, an aluminum sheet metal housing structure 8 to support the lens 4 at the proper position above the solar cell packages 6, and an extruded aluminum heat sink 10 to dissipate the waste heat from the solar cell packages 6. The assembly 7 of heat sink 10 and solar cell packages 6 is generally referred to in the art as a photovoltaic receiver since it receives the focussed sunlight and converts a portion of this sunlight into usable electricity.

In a preferred application, a full-size module and full-size receiver would normally include about 37 solar cell packages and have a length dimension of about 4 meters or 12 feet. The lens which focuses light onto the receiver would typically have sun-capturing aperture dimensions of 1 meter in width by 4 meters in length. This lens is preferably configured according to the optimized design taught by O'Neill in his U.S. Pat. No. 4,069,812, the disclosure of which is herein incorporated by reference.

Figure 2:
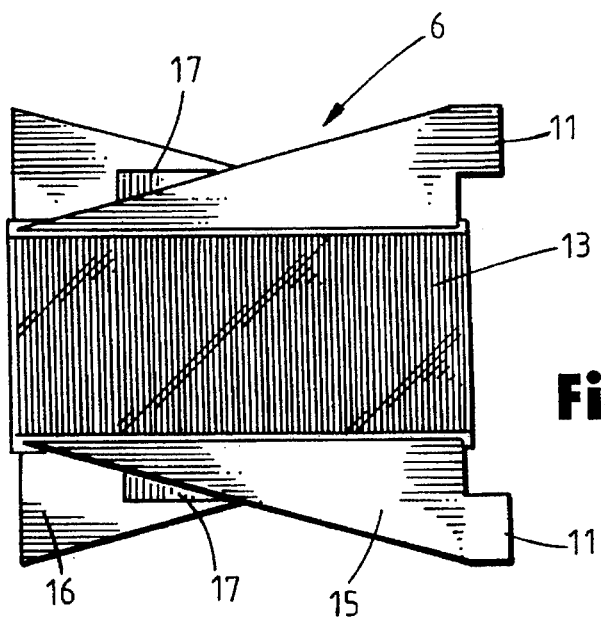
FIG. 2 shows a top view of the cell package of the present invention, including one cell, four solder-plated copper ribbons, two bypass diodes, and a prismatic cell cover.

FIG. 2 illustrates a preferred embodiment of the novel solar cell package construction which is integral to the photovoltaic receiver of the present invention. By reference to FIGS. 1 and 2, each cell package 6 comprises one silicon solar cell 13, four solder-plated copper ribbons 15 and 16, two silicon bypass diodes 17, and one silicone rubber prism cover 19 attached to the top of solar cell 13. In one preferred embodiment, the dimensions of cell 13 are contemplated to be about 4 cm in width by about 10 cm in length. Cell 13, diodes 17, and copper ribbons 15 are typically attached together by reflow-soldering.

Prism cover 19 comprises an optical device which improves the performance of solar cell 13 by eliminating gridline conductor shading losses on the top surface of said cell 13, as more fully described by O'Neill in U.S. Pat. No. 4,711,972, the disclosure of which is incorporated herein.

In a typical embodiment, 37 solar cell packages 6 are attached to one heat sink 10 with the tabs 11 on the upper copper ribbons 15 of each cell package 6 placed over the lower copper ribbons 16 of the adjoining cell package 6. These cells are then joined in series by reflow soldering the tabs. Typically, all 37 cells are thus joined into a series-connected cell string.

Figure 3:
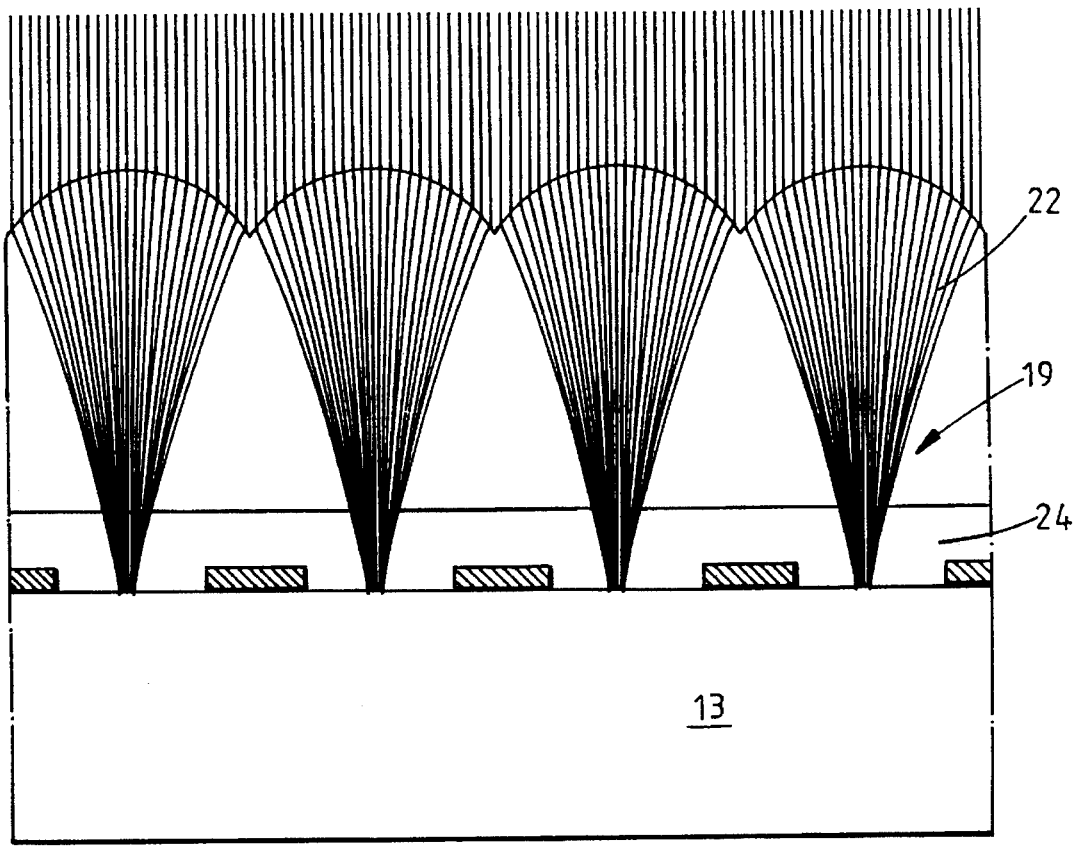
FIG. 3 shows a cross-sectional view of the prism cover element of the cell package as illustrated in FIG. 2.

FIG. 3 illustrates the construction and optical effect of the novel prism cover 19 to be employed in the present invention which includes cylindrical optical elements 22 molded into the upper surface of clear silicone material and transparent pressure sensitive adhesive (PSA) 24 attached to the lower smooth surface of the silicone optical material. The PSA 24 is used to facilitate attachment of the prism cover 19 to the solar cell 13.

Figure 4:
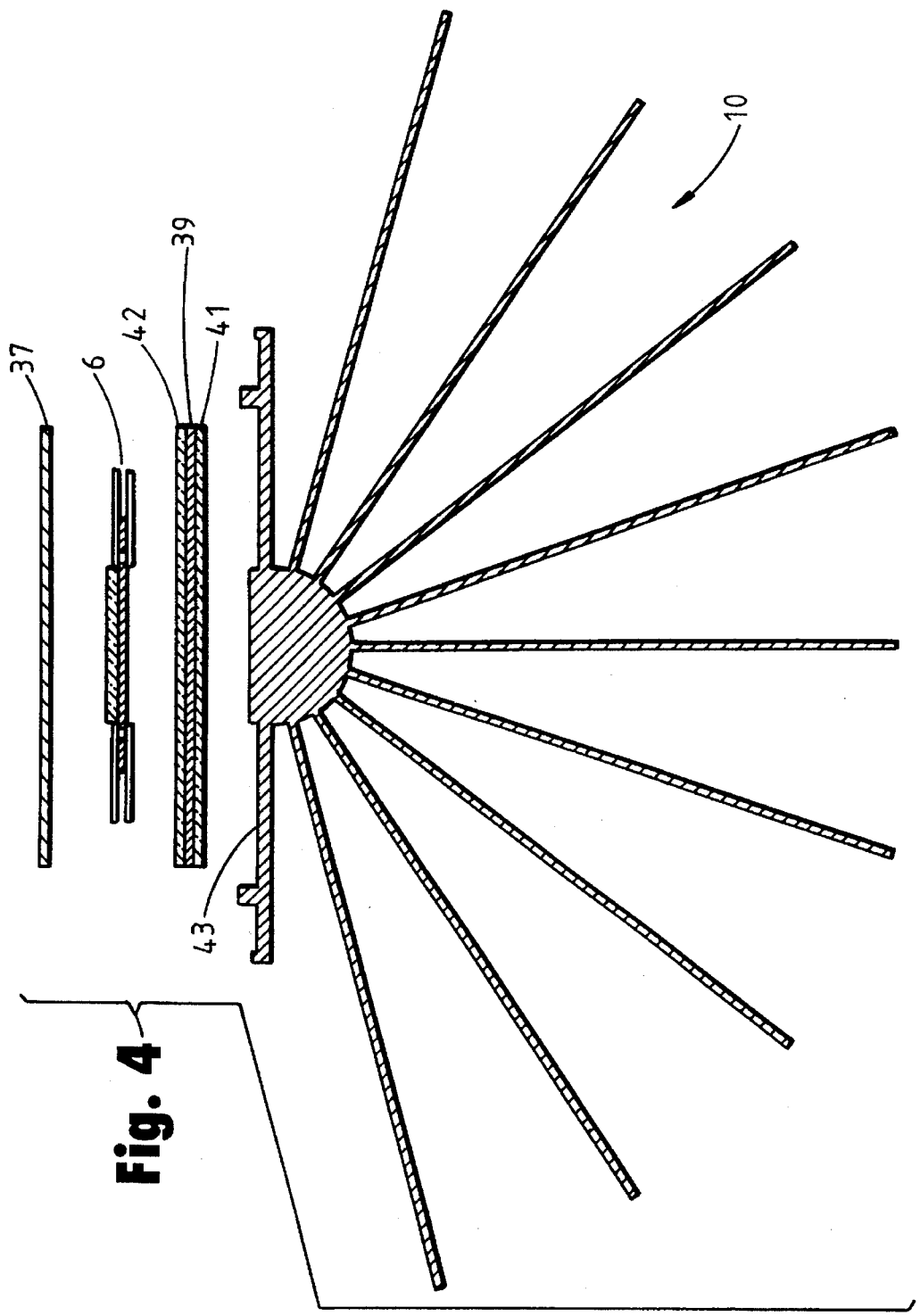
FIG. 4 illustrates an exploded cross-sectional view of a preferred embodiment of the receiver configuration of the present invention.

FIG. 4 illustrates an exploded cross-sectional view of one preferred embodiment of the construction of the receiver 30 of the present invention comprising the previously described heat sink 10, one of several solar cell packages 6, and an upper 37 and a lower 39 transparent Tefzel dielectric film encapsulation layer. In a preferred embodiment, the lower Tefzel film layer 39 includes a pressure sensitive adhesive (PSA) on both its lower 41 and upper surfaces 43. The upper Tefzel film layer 37 does not include any PSA.

By reference to the foregoing disclosure, a general assembly method of the receiver of the present invention is set forth as follows. Lower Tefzel film layer is applied to a heat sink using pressure sensitive adhesive to implement the attachment. This film layer is applied over the full length of the heat sink. A disposable paper liner may be used to protect the upper PSA prior to subsequent steps. Each cell package is then attached to the lower Tefzel film layer using the upper PSA to implement the attachment. In a typical embodiment, 37 cell packages are thus attached to the receiver. The cell packages are then joined together electrically by reflow soldering of the overlapping solder-plated copper tabs on adjacent cell packages. The top Tefzel film layer is then applied over the full receiver making intimate contact with the peripheral edges of the exposed upper PSA on the lower Tefzel film. No additional PSA is employed to permanently bond the top Tefzel film to the lower Tefzel film, forming a water-tight encapsulating dielectric envelope around the entire cell string. This upper Tefzel film is only loosely draped over the prism covers on the cell packages, and is not bonded thereto; otherwise the beneficial optical effect of the prism cover could be diminished. Finally, a small penetration is made in the upper Tefzel film layer on each end of the receiver to provide for an insulated wire to be attached to the positive and negative ends of the cell string, respectively. After the wire is attached, the small penetrations are carefully sealed.

The method of assembly of a preferred embodiment of the photovoltaic receiver of the present invention may be described as follows by reference to FIGS. 1–4.

Solder plated copper ribbon is fabricated to form four arrowhead-shaped conductor components 15 and 16 as illustrated in FIG. 2. Conductor components 15 and 16 form the top and bottom electrical contacts to the solar cell 13 and diode 17. Bypass diode 17 is sandwiched between each pair of conductors 15 and 16, thereby providing the physical separation between top 15 and bottom 16 conductors so as to eliminate the need for the addition of additional dielectrics. Solar cell 13, conductor components 15, 16, and diode 17 are then electrically joined by a heat reflow process. It is desirable that no additional solder be added and that no residue flux be employed.

A series of 37 cell packages 6 are then attached to the heat sink 10 via a Tefzel tape strip 39 which has been provided with a pressure sensitive adhesive about the entirety of its top and bottom surfaces. Cell packages 6 are electrically joined together by reflow soldering the copper ribbon tabs 11 between adjacent cells 13. It is desirable that cells 13, when electrically combined, define a length and width smaller than that of strip 39 so as to define an adhesive border thereabout. The upper surface of heat sink 10 defines a raised area 43 sized to approximately match the cell 13 active width which is illuminated by the Fresnel lens 4 illustrated in FIG. 1.

The particular dielectric tape 39 used in this example is sold under the trademark DuPont®Tefzel $T^2$, although other dielectric tapes having similar durability characteristics may also be used. Tape layer 39 is preferably a pretensioned fluropolymer having an average thickness of some 90 microns, including both PSA layers. In such a fashion, heat conduction from the cell 13 to the heat sink 10 is maximized. In this connection, the temperature differential between cell 13 and sink 10 is preferably no more than ten to thirteen degrees centigrade.

A single piece prism cover 19 in tape form is then applied over the cell package 6 in the manner earlier described. Cover 19 is preferably comprised of a silicone material as made by The 3M Company. In a preferred embodiment, an elongate prism in tape form and including pressure sensitive adhesive on the cell mounting surface is used. ( See FIG. 3 ) Finally, an upper transparent Tefzel dielectric film layer 37 is loosely placed over the electrically coupled cells 13 and is bonded to the lower Tefzel film layer 39 along the exposed edges and ends of said layer 39 using the exposed pressure sensitive adhesive.

This completes the receiver assembly process except for the attachment of the end electrical feedthrough/pigtail assemblies to the electrical load or storage means as earlier described.

The aforedescribed exemplary embodiment allows the receiver to pass a wet receiver insulation test while the cell string is maintained at 2,200 VCD relative to the heat sink. Under such testing, the cell receiver experiences less than one microamp of leakage current.

Other embodiments are also contemplated as within the spirit of the present invention. For example, an antireffective coating on the Tefzel film or film surfaces may be used to enhance performance of the solar cells. Uncoated Tefzel film demonstrates a 94% transmittance. Antireffective coating of the films could improve transmittance in the order of 5%, which translates to a module power gain of some 25–30 W.

Other embodiments also contemplate the use of a thermally loaded pressure sensitive adhesive. Contemporary acrylate PSA demonstrates a thermal conductivity in the range of 0.24 W/m –K. A thermally loaded PSA, such as an alumina loaded PSA, will reduce the cell to heat sink $\Delta T$ by some 40%.

Compared to prior art receivers, this new receiver offers significant advantages in performance, cost, robustness, and manufacturability. Due to its superior mechanical and dielectric strength, the lower PSA-coated Tefzel film can be made very thin to provide low thermal resistance between the cell package and the heat sink. In the preferred embodiment, the PSA is an acrylate material with a total thickness of 25 microns applied to each surface of the 37 micron thick Tefzel. Thus, the total thickness of this mounting film and adhesive can be as thin as 87 microns. Despite this small thickness, tests have demonstrated a dielectric strength greater than 6,000 volts of mounting film and adhesive. Prior art receivers typically required over 600 microns of alumina-loaded silicone rubber adhesive below the cell to ensure a dielectric strength of 2,200 volts.

The upper Tefzel film is typically 62 microns thick and contains no PSA layers. This upper film provides a continuous layer of dielectric protection over the entire receiver. Prior art receivers were typically only sealed incrementally by applying liquid silicone material between and around cell packages using syringes. Such prior art receivers rarely, if ever, were able to pass a dielectric isolation test with water covering the receiver. This water could fill pin holes in the silicone material causing shorts between the cell string and the heat sink. A continuous silicone layer could not be used as the upper encapsulating layer in prior art receivers, since such a layer would be applied as a liquid which would fill in the valleys on the prism covers and destroy the performance gains provided by these optical devices. Thus, the new upper Tefzel film solves for the first time the problem of sealing a prism-covered cell receiver against moisture-related dielectric failures. Such failures can be caused by condensation or rain infiltration into concentrator modules.

The new receiver approach also enables the use of PSA to apply prism covers to solar cells. For prior art receivers, PSA could not be used to apply prism covers to solar cells, because the PSA joint would fail during thermal and humidity cycling. The mechanism of this failure was always water migration to the PSA layer, followed by bubble formation and adhesive delamination. For the new receiver, the upper Tefzel film prevents moisture from reaching either the prism cover or the PSA between the prism cover and the solar cell.

Although particular detailed embodiments of the apparatus and method have been described herein, it should be understood that the invention is not restricted to the details of the preferred embodiment. Many changes in design, composition, configuration and dimensions are possible without departing from the spirit and scope of the instant invention.

What is claimed is:

1. A photovoltaic receiver comprising:
   one or more photovoltaic cells for generating electrical power in response to electromagnetic radiation, where said cells each define a from surface and a back surface, where said cells are adapted to be coupled to an electrical load by means of electrical conductors;
   one or more bypass diodes coupled to said cells and said conductors, the combination forming a cell package;
   a transparent front cover having a predetermined refractive index and having from and back surfaces, where said from cover is positioned over said cells;
   said photovoltaic cells being secured at their back surfaces to a heat sink via the use of a dielectric film layer provided with an adhesive on both its upper and lower surfaces, where the photovoltaic cells define a shorter width and length relative to said film layer such that the application of said cells to said layer defines an exposed adhesive border around said cells; and a second dielectric film layer of a size similar to that of said first layer, where said top layer is positioned over said cell package and said front cover and secured to said first layer so as to encapsulate said cells from moisture.

2. The receiver of claim 1 wherein said dielectric film layer includes an impermeable Tefzel fluoropolymer film.

3. The receiver of claim 2 wherein said film layer is pretensioned.

4. The receiver of claim 1 where said electrical conductors include an upper and lower copper ribbon.

5. The receiver of claim 1 where said photovoltaic cells, electrical conductors, and diodes are electrically coupled via the use of reflow soldering.

6. The receiver of claim 1 wherein said heat sink defines an upper attachment surface and a lower surface, where said upper surface includes a raised area to accommodate the width of the photovoltaic cell, and said lower surface being radially configured and provided with a plurality of cooling fins.

7. The receiver of claim 6 wherein said raised area is defined by a series of protrusions to aid in encapsulation.

8. The receiver of claim 1 where said adhesive is a pressure sensitive adhesive.

9. The receiver of claim 8 wherein said adhesive is thermally loaded.

10. The receiver of claim 1 where one or more of said film layers is coated.

11. A method of assembling a photovoltaic receiver comprising the steps of:

electrically coupling at least one photovoltaic cell, a pair of electrical conductors, and a bypass diode such that said diode is disposed between said conductors, where the combination of photovoltaic cell, conductors, and diode form a cell package;

providing an adhesive on upper and lower surfaces of a first impermeable dielectric film layer;

affixing said first impermeable dielectric film layer to a heat sink where said film layer has a length and width greater than that of said cell package;

securing said cell package to said first film layer and said heat sink so as to define an adhesive border about the edges of said cell package;

securing a transparent front cover over said photovoltaic cell, where said cover has a predetermined refractive index and opposed first and second surfaces, said first surface having a contour comprising a plurality of spaced apart identical prismatic sections;

encapsulating the cell package by placing a transparent second impermeable dielectric film layer over said cell package and into contact with the adhesive border area defined about said first film layer; and providing means for electrical connection between said cell package and an electrical load.

12. The method of claim 11 wherein said electrical connectors comprise copper ribbons.

13. The method of claim 11 wherein said cell, electrical connectors, and diode are secured via the use of reflow soldering.

14. The method of claim 11 wherein said film layers include a pretensioned, Tefzel fluoropolymer film.

15. The method of claim 11 further including providing a pressure sensitive adhesive on the upper and lower surfaces of said first film layer.

16. The method of claim 15 where said pressure sensitive adhesive is thermally loaded.

17. A photovoltaic receiver assembly comprising:

a plurality of photovoltaic cells for generating electrical power in response to electromagnetic radiation, where said cells each define front and back surfaces of a selected length and width, said photovoltaic cells adapted to being coupled to an electrical load or storage means via a pair of electrical connectors disposed in a spaced relation relative to each other;

a bypass diode positioned between and electrically coupled to said connectors;

a transparent front cover of a predetermined refractive index and having opposed first and second surfaces, where said first surface has a contour comprising a plurality of spaced apart prismatic sections, where said front cover possesses a width and length to match that of said plurality of said photovoltaic cells;

a heat sink having a top surface and a bottom surface, where said top surface defines a raised shelf and said bottom surface defines a series of radially disposed cooling fins;

said photovoltaic cells being secured to said heat sink via the use of a first pretensioned, Tefzel fluoropolymer film, where said film is provided on its upper and lower surfaces with a pressure sensitive adhesive, where said first film has a length and width greater than that of said plurality of cells so as to define an adhesive border around said cells; and a second pretensioned, Tefzel fluoropolymer film disposed over said cells and secured to the border defined on said film so as to encapsulate said cells.

18. The receiver of claim 17 wherein said front cover is made from one piece.

19. The receiver of claim 17 wherein the pressure sensitive adhesive is thermally loaded.

20. The receiver of claim 17 where the $\Delta T$ between the photovoltaic cells and the heat sink during operation is less than or equal to twenty degrees centigrade.

21. A method of constructing a photovoltaic receiver, comprising:

securing a solar cell to a heat sink via a first dielectric film, where the $\Delta T$ between said solar cell and said heat sink during operation is less than or equal to 20° centigrade;

securing a light concentrating means over said cell;

providing means for coupling said cell to an electrical load or storage means;

securing a second dielectric film over said cell and light concentrating means so as to encapsulate the combination without applying adhesive directly to the solar cell or concentrating means.

22. A photovoltaic receiver for a concentrating photovoltaic module, said receiver adapted to being positioned at or near the focused sunlight from a lens or mirror optical concentrator and including the following elements:

one or more solar cell packages, each package comprising at least one solar cell and metallic conductors attached to said solar cell;

a first dielectric film layer having pressure sensitive adhesives on both its upper and lower surfaces, with the lower adhesive surface of said first film layer bonded securely to a heat sink, and with the upper adhesive surface of said first film layer securely bonded to the nonilluminated rear surface of said solar cell package; and a second dielectric film layer positioned over said first film layer thereby forming a dielectric envelope around said solar cell packages so as to encapsulate said solar cell packages.

* * * * *